(12) United States Patent
Binyamini et al.

(10) Patent No.: US 9,099,200 B2
(45) Date of Patent: Aug. 4, 2015

(54) SRAM RESTORE TRACKING CIRCUIT AND METHOD

(71) Applicant: International Business Machines Corporation, Armonk, NY (US)

(72) Inventors: Lior Binyamini, Tel Aviv (IL); Noam Jungmann, Tel Aviv (IL); Elazar Kachir, Haifa (IL); Donald W. Plass, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 13/928,949

(22) Filed: Jun. 27, 2013

(65) Prior Publication Data

US 2015/0003147 A1    Jan. 1, 2015

(51) Int. Cl.
  *G11C 11/00* (2006.01)
  *G11C 11/419* (2006.01)
  *G11C 7/22* (2006.01)
(52) U.S. Cl.
  CPC .............. *G11C 11/419* (2013.01); *G11C 7/227* (2013.01)
(58) Field of Classification Search
  USPC .......................................... 365/154, 194, 205
  See application file for complete search history.

(56) References Cited

U.S. PATENT DOCUMENTS

| 6,064,616 | A | 5/2000 | Ciraula et al. | |
|---|---|---|---|---|
| 7,272,030 | B2 | 9/2007 | Chan et al. | |
| 7,693,001 | B2 * | 4/2010 | Golke et al. | 365/230.05 |
| 7,755,964 | B2 | 7/2010 | Jung et al. | |
| 7,876,600 | B2 | 1/2011 | Zhang et al. | |
| 8,228,713 | B2 * | 7/2012 | Arsovski et al. | 365/154 |
| 8,233,337 | B2 | 7/2012 | Arsovski et al. | |
| 8,379,467 | B2 * | 2/2013 | Deng et al. | 365/201 |
| 8,730,713 | B2 * | 5/2014 | Garg et al. | 365/154 |
| 8,767,494 | B2 * | 7/2014 | Yang et al. | 365/203 |
| 2011/0216618 | A1 | 9/2011 | Prasad et al. | |
| 2012/0195106 | A1 | 8/2012 | Wang et al. | |

FOREIGN PATENT DOCUMENTS

WO    2007143458 A2    12/2007

OTHER PUBLICATIONS

Ken Mai, "Desing and Analysis of Reconfigurable Memories," a dissertation submitted to the Department of Electrical Engineering and the Committee on Graduate Studies in partial fulfillment of the requirements for the Degree of Doctor of Philosophy, Stanford University, Jun. 2005.

* cited by examiner

*Primary Examiner* — Pho M Luu
(74) *Attorney, Agent, or Firm* — International IP Law Group

(57) ABSTRACT

A novel and useful SRAM restore tracking circuit adapted to improve the tracking of SRAM cell behavior for different PVT corners. The SRAM array access path is mainly influenced by two stages: (1) the wordline (WL) delay and (2) the SRAM cell delay. These two stages are usually the most sensitive for process variation in the memory access path. The restore tracking circuit incorporates two novel topologies for enhanced tracking to SRAM cell behavior. The first topology is a circuit that functions to mimic the wordline load and delay characteristics. The WL stage is very sensitive to process variation due to the large load it must drive and the usually relatively poor slope (i.e. depending on the number of cells the WL). The second topology is a circuit that mimics the SRAM cell load and delay characteristics. The SRAM cell is very sensitive to process variation due to its very small device features and the high number of cells in the memory array.

18 Claims, 4 Drawing Sheets

SRAM RESTORE TRACKING CIRCUIT AND METHOD

FIELD OF THE INVENTION

The present invention relates to the field of semiconductor memory, and more particularly relates to a static random access memory (SRAM) restore tracking circuit and related method.

BACKGROUND OF THE INVENTION

The basic operation of a static random access memory (SRAM) array is typically divided into evaluation time and restore time. The proper operation of the SRAM memory requires that sufficient time be allotted to the evaluation time. In practice, this time is related to the time the wordline (WL) is active. The evaluation and restore time are determined by the specific circuits implemented in the memory array. The behavior exhibited by the SRAM cell differs greatly across different PVT corners. This requires adaptation of the evaluation time accordingly for the different PVT corners.

Digital circuitry, however, does not typically allow proper tracking due to the special nature of the SRAM cell combined with the fact that its behavior does not track well with regular logic behaviors due to the small device sizes of the SRAM cell components. Significant errors in tracking of the restore signal are likely to lead to functional failure due to the SRAM cell not being able to fully evaluate cell contents in the given time. For example, as the supply voltage decreases, the required evaluation time increases in order to allow the bitline (BL) to discharge, which is now lengthened due to the drop in supply voltage. In such cases, the WL pulse width is typically not sufficient to read the cell. This can be seen in the graph shown in FIG. 3A for example.

The evaluation process in practice is sensitive to PVT variations. In particular, the passgate transistor of the typically SRAM memory cell is very sensitive to changes in gate voltage. Changes in the threshold voltage also affect the operation with a key problem being threshold voltage mismatch in the array.

To solve this problem, one prior art solution uses digital delay chains to produce the required amount of delay. This solution, however, does not track SRAM behavior well especially in extreme PVT corners.

Another prior art solution attempts to mimic the array access path using a dummy bit line. In this method a "dummy" column of cells are used that produces an SRAM like delay. This, however, adds complexity to the SRAM core as you cannot have a standalone column of cells due to printability issues. Further, yields may suffer due to the relatively small SRAM cell features.

Yet another prior art solution is to drive the restore (i.e. the evaluation end) from the mid cycle clock edge. This, however, usually enforces very high hold requirements as the evaluation pulse width is very wide. It requires a slow frequency or special duty cycle and is sensitive to clock jitter.

There is thus a need to improve the restore tracking to cover variations in PVT including PVT corners that does not suffer from the disadvantages of prior art solutions discussed above.

SUMMARY OF THE INVENTION

A novel and useful SRAM restore tracking circuit adapted to improve the tracking of SRAM cell behavior for different PVT corners. The SRAM array access path is mainly influenced by two stages: (1) the wordline (WL) delay and (2) the SRAM cell delay. These two stages are usually the most sensitive for process variation in the memory access path.

The present invention provides a restore tracking circuit that incorporates two novel topologies for enhanced tracking to SRAM cell behavior. The first topology is a circuit that functions to mimic the wordline load and delay characteristics. The WL stage is very sensitive to process variation due to the large load it must drive and the usually relatively poor slope (i.e. depending on the number of cells the WL).

The second topology is a circuit that mimics the SRAM cell load and delay characteristics. The SRAM cell is very sensitive to process variation due to its very small device features and the high number of cells in the memory array.

BRIEF DESCRIPTION OF THE DRAWINGS

The invention is herein described, by way of example only, with reference to the accompanying drawings, wherein.

DETAILED DESCRIPTION OF THE INVENTION

The present invention provides a restore tracking circuit that incorporates two novel topologies for enhanced tracking to SRAM cell behavior. The first topology is a circuit that functions to mimic the wordline load and delay characteristics. The WL stage is very sensitive to process variation due to the large load it must drive and the usually relatively poor slope (i.e. depending on the number of cells the WL is driving). In weak PVT corners, the wordline exhibits slow slew rates due to the essentially long wire it must drive with associated resistance and capacitance characteristics. The second topology is a circuit that mimics the SRAM cell load and delay characteristics. The SRAM cell is very sensitive to process variation due to its very small device features and the high number of cells in the memory array.

These two topologies combined make the restore delay behave similarly to the SRAM delay in different PVT conditions. The restore path functions to generate the internal SRAM array clock pulses. For example, the restore circuit allows for the proper slowdown of the restore path in slow PVT corners to postpone the restore start when the SRAM cell is very weak and requires additional evaluation time for proper operation.

Note that the restore circuitry functions to mimic the behavior of the wordline and bitline. Ideally, the restore circuit perfectly tracks the actual array. In practice, however, this is difficult to achieve. If the restore circuit is too fast (i.e. the wordline/bitline pulse widths are too short), data may be lost. On the other hand, if the restore circuit is too slow (i.e. the wordline/bitline pulse widths are too long), the data cycles are needlessly drawn out.

Figure 1:
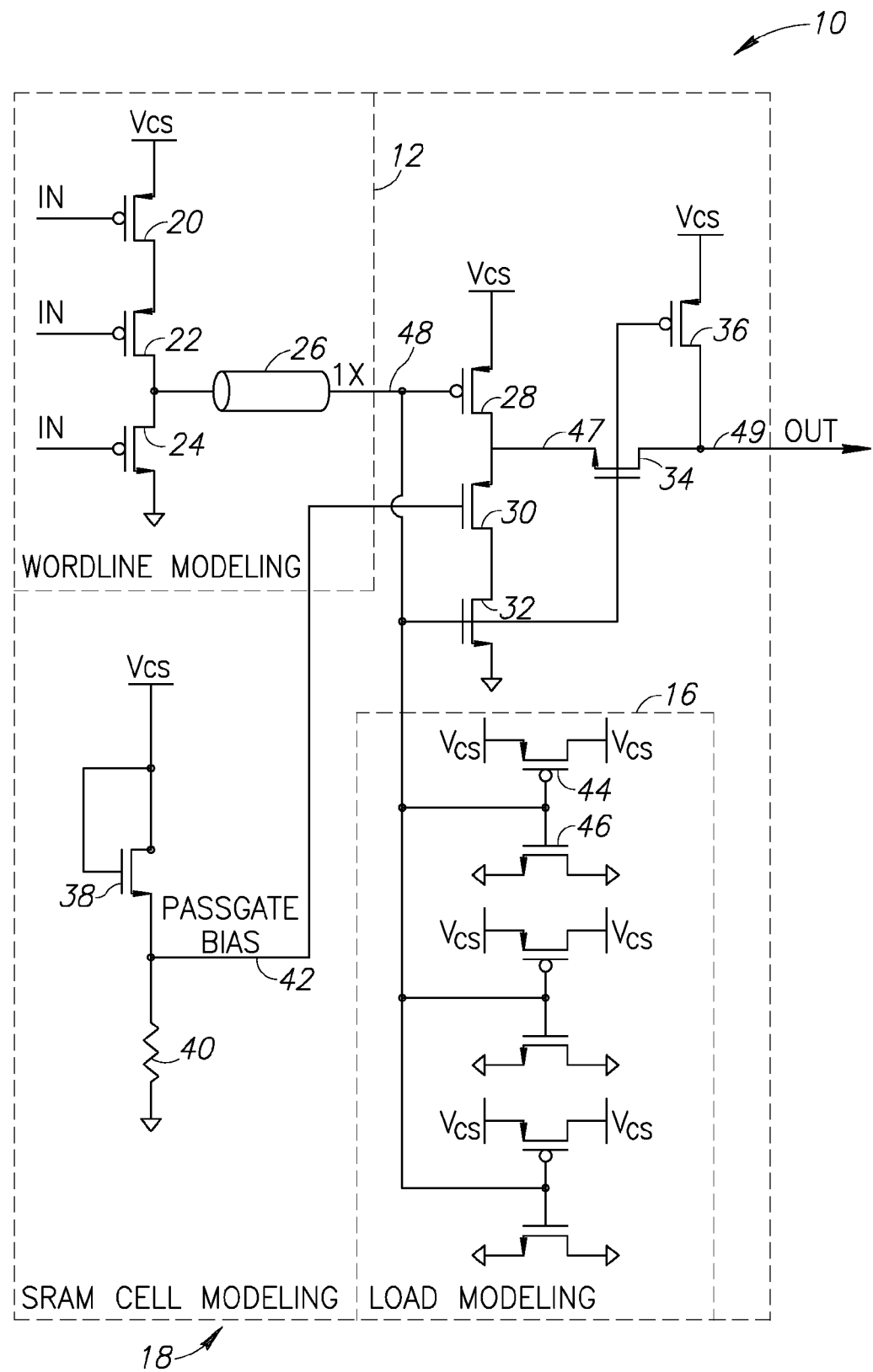
FIG. 1 is a schematic diagram illustrating an example SRAM restore tracking circuit constructed in accordance with the present invention.

A schematic diagram illustrating an example SRAM restore tracking circuit constructed in accordance with the present invention is shown in FIG. 1. The restore circuit, generally referenced 10, comprises a wordline modeling circuit stage 12, SRAM cell modeling circuit stage 19 and a load modeling circuit stage 16.

The wordline modeling stage comprises PFET transistors 20, 22, NFET transistor 24 and wordline wire emulation 26 having a similar width but shorter length than the actual wordline. The wordline modeling stage functions to emulate the WL stage of the array. The stacked PFET transistors function as a driver where the strength of the PFETs are controlled. The long WL wire 26 and load 16 functions to emulate the real WL network. The load stage 16 comprises a plurality of pairs of back to back PFET and NFET transistors, 44, 46, respectively, connected to the supply voltage and ground for simulating the real WL load. The load modeling stage is operative to simulate the slew rate, resistance and capacitance characteristics of the WL.

The SRAM cell modeling circuit stage 18 comprises PFET transistor 28, NFET transistors 30, 32, 38 and resistor 40. The passgate bias voltage 42 is generated across resistor 40 and is input to the gate of passgate transistor 30. The WL drive signal 48 is input to the gates of transistors 28, 32, 34 and 36. The signal 49 output of the modeling stage circuit is used to drive the actual WL in the SRAM array. The transistor 32 functions to mimic the pull-down transistor of the array cell, i.e. discharging the BL on the '0' side of the cell.

The topology of the circuit 10 is configured to be similar to the actual SRAM cell.

Device relationships are maintained but the sizes are substantially increased, such as by a factor of ten, in order to avoid small device sizes with the associated sensitivity to process variation. The dimensions of the load modeling circuit are also maintained but increased by a similarly high factor, e.g., a factor of ten. This alone, however, is insufficient to properly achieve restore tracking because the SRAM cell is plagued by very high threshold voltage ($V_T$) mismatch due to the small device sizes and large number of instances.

To achieve better quality restore tracking, the gate of the NFET that drives the node 47 is connected to an internally generated bias voltage. This voltage drop is similar to the supply voltage $V_{CS}$ drop in slow PVT corners but since the starting voltage level is lower than VCS, the voltage drop is more significant and this causes a delay in the circuit stage 18 thus matching the slowness of the actual SRAM array.

It is noted that the bias drop is similar to the supply drop (but not larger than the supply drop). Since the bias voltage is only approximately 750 mv to start with at nominal conditions, however, the voltage drop is more significant and causes higher delay. This better emulates the slowest SRAM cell where due to process mismatch has a higher $V_T$ that translates to lower overdrive (i.e. $V_{gate}$-$V_T$) and is more sensitive to $V_{gate}$ (supply) drop. Instead of increasing $V_T$ in the dummy circuit the bias level is reduced to start with.

Note also that bias voltage sensitivity to supply drop can also be controlled. This is achieved by changing the relationship between resistor to diode in the higher impedance. In this manner, how much delay is added can be controlled in slow corners based on hardware results.

The threshold voltage is a function of PVT and it is desirable to mimic its behavior even though it cannot be controlled. The VT mismatch can be compensated for, however, by controlling the gate voltage (i.e. bias voltage) on the passgate transistor 30. This is one of the objectives of the circuit 10.

Figure 2:
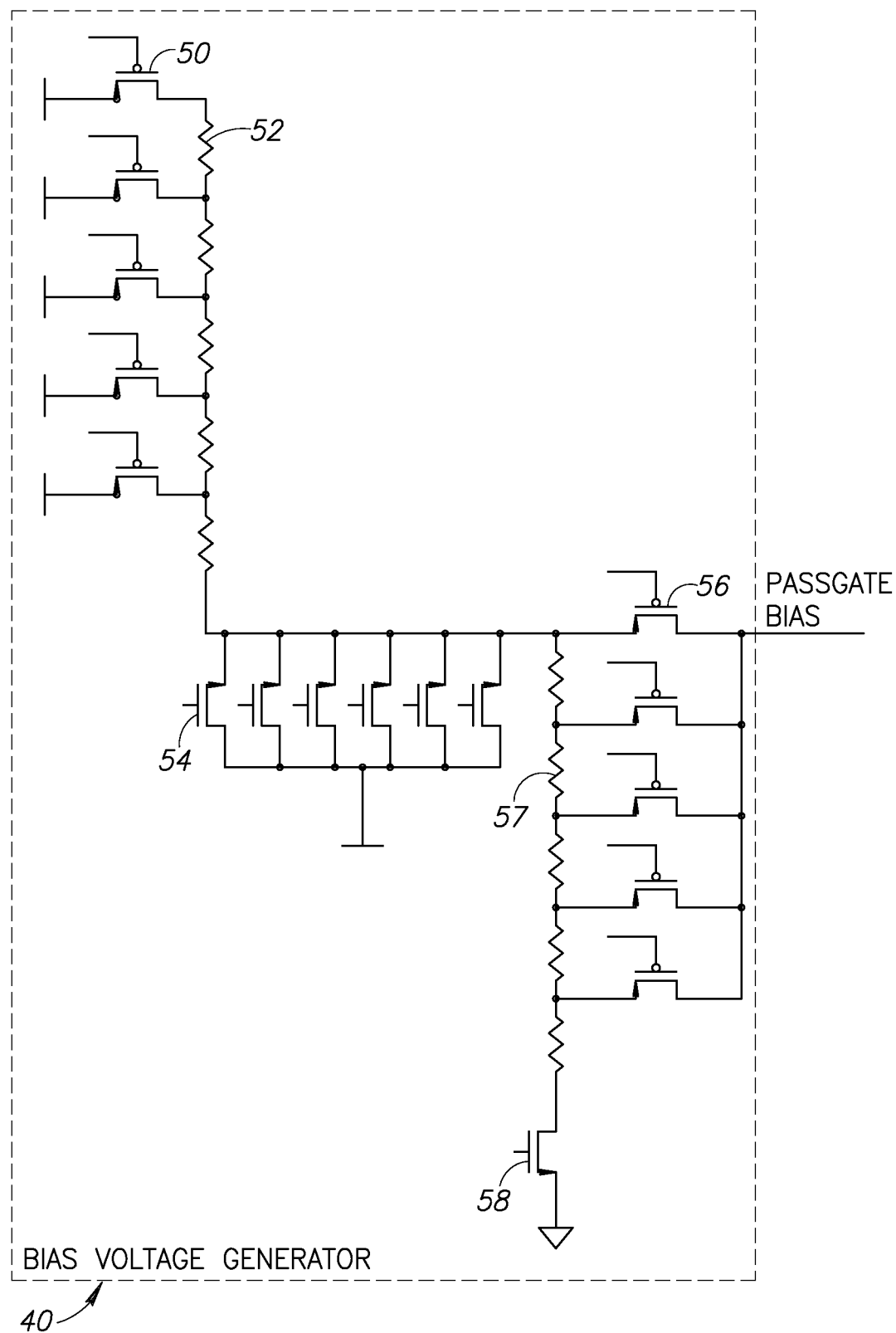
FIG. 2 is a schematic diagram illustrating an example passgate bias voltage circuit.

A schematic diagram illustrating an example passgate bias voltage circuit is shown in FIG. 2. The bias voltage generator circuit, generally referenced 40, comprises a voltage divider made up of a plurality of PFET transistors 50 and resistors 52. Each transistor 50 is coupled to the supply voltage and a control signal. Only one of the transistors 50 is active at one time. The circuit 40 also comprises a plurality of NFET transistors 54 in parallel where each is connected to the supply voltage and a control signal. Only one transistor 54 is active at any one time. Preferably, each transistor has a different dimension to enable better control of the bias voltage. The circuit 40 also comprises a divider that includes a plurality of PFET transistors 56 and resistors 57 connected to NFET transistor 58. The drain terminals of the transistors 56 are connected in parallel to generate the passgate bias voltage.

The bias circuit 40 is essentially a voltage divider between the resistors 57 (i.e. the lower impedance) and a combination of diode and resistor devices (i.e. upper impedances). The combination of resistors and diodes enables the control of the sensitivity of the output voltage in different PVT corners. As the upper impedance is dominated by diode devices, it will drive the output bias voltage lower as the supply voltage drops. The bias voltage at the output of this stage controls the speed of the SRAM stage. The circuit functions to track swings in supply voltage and PVT variations.

In operation, the bias voltage tracks changes in threshold voltage $V_T$ due to process variations. It also tracks changes to the supply voltage $V_{CS}$.

Figure 3A:
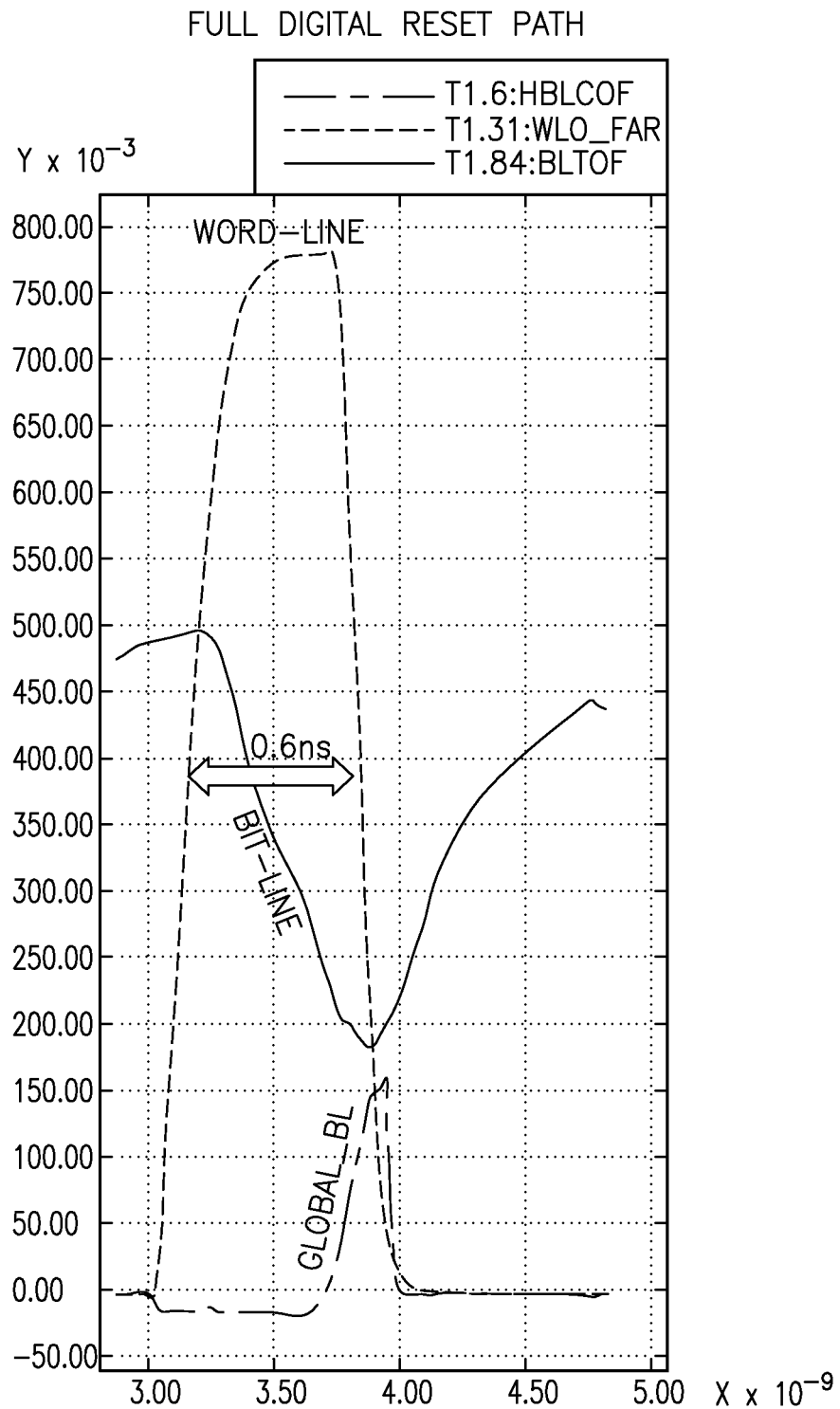
FIG. 3A is a graph illustrating an example full digital reset path including wordline and bitline signal traces.

A graph illustrating an example full digital reset path including wordline and bitline signal traces is shown in FIG. 3A. This graph illustrates the wordline and bitline signals for an example array for a slow PVT corner and low supply voltage ($V_{CS}$=800 mV; $V_{DD}$=600 mV) without the SRAM restore tracking circuit of the present invention. As indicated in the graph, the wordline pulse width is too narrow and the bitline is only partially discharged. In addition, the global bitline fails to charge up.

Figure 3B:
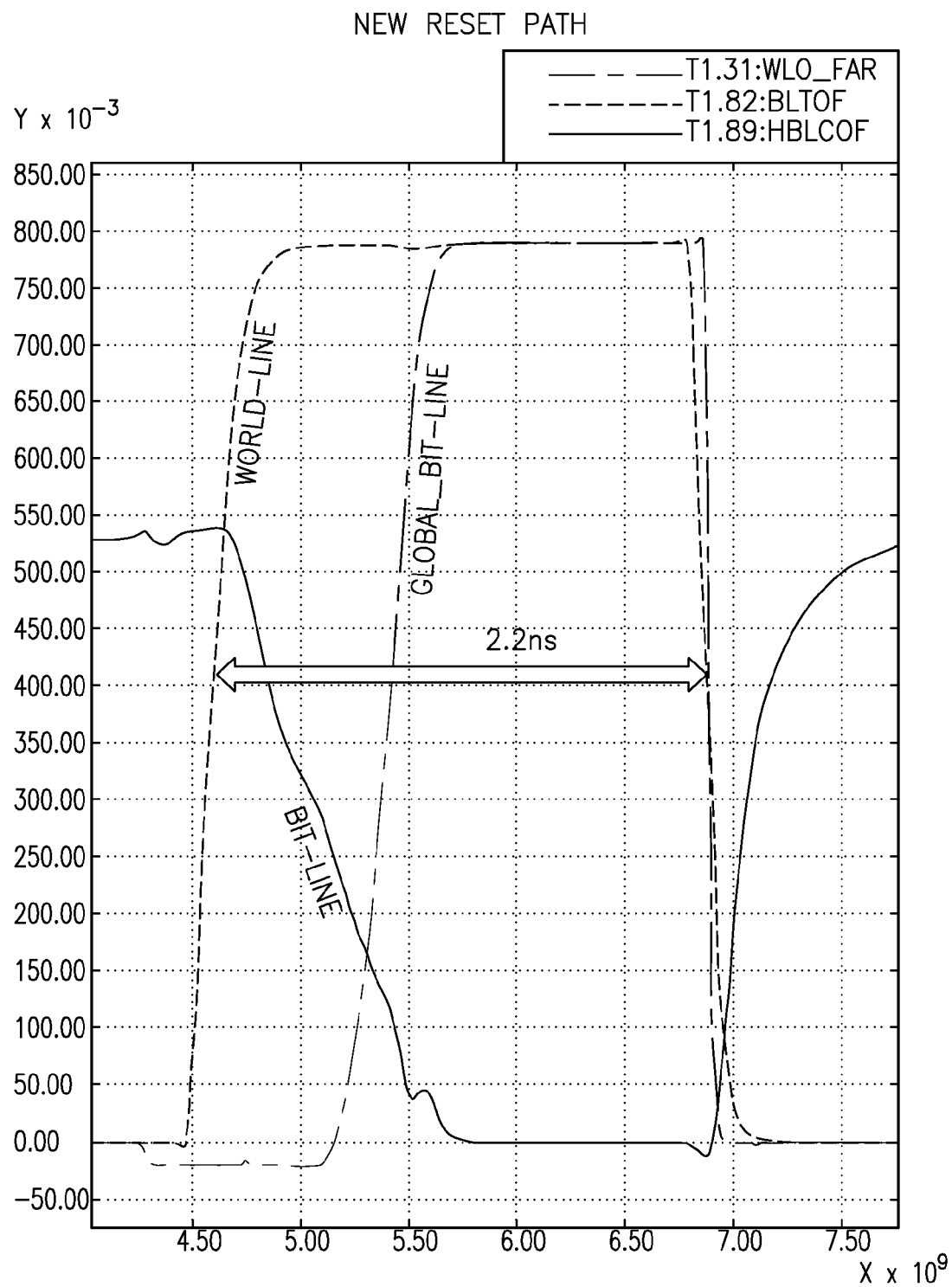
FIG. 3B is a graph illustrating wordline and bitline signal traces utilizing the restore tracking circuit of the present invention.

A graph illustrating wordline and bitline signal traces utilizing the restore tracking circuit of the present invention is shown in FIG. 3B. In this graph, the wordline and bitline signals for an example array are shown for the same slow PVT corner and low supply voltage, but with the benefit of the SRAM restore tracking circuit of the present invention. As indicated in the graph, the wordline pulse width is much wider and the bitline is fully discharged. In addition, the global bitline is fully charged.

Thus, by (1) modeling the SRAM pull-down and passgate transistors and the WL delay combined with (2) the compensation for $V_T$ mismatch by dynamically adjusting the bias voltage applied to the passgate, an SRAM restore tracking signal is generated that better matches PVT corners.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of static random access memory (SRAM) restore tracking in a SRAM array, said method comprising:
   providing first circuitry operative to emulate wordline (WL) load and delay behavior;
   providing second circuitry, including a passgate transistor, operative to emulate SRAM cell load and delay behavior, the second circuitry comprising a WL driver coupled to a wire and load simulation circuit adapted to simulate resistance, capacitance and slew rate of actual WL; and
   dynamically adjusting a bias voltage applied to the gate of said passgate transistor so as to compensate for threshold voltage ($V_T$) mismatch among cells in said SRAM array.

2. The method according to claim 1, wherein devices in said second circuit retain device relationships of real SRAM cells but are N times as large in order to minimize sensitivity to process variations.

3. The method according to claim 1, wherein the bias voltage applied to said passgate device is adapted to track $V_{CS}$ whereby a drop in $V_{CS}$ results in a corresponding drop in threshold voltage and bias voltage.

4. The method according to claim 1, wherein the voltage drop generated across said passgate device is larger than the supply voltage drop in a slow PVT corner thereby generating a WL restore delay that matches the speed of said SRAM array.

5. A static random access memory (SRAM) restore tracking circuit for use in a SRAM array, comprising:
   a wordline (WL) circuit stage operative to simulate the WL load and delay behavior, said WL circuit stage comprising a WL driver coupled to a wire and load simulation circuit adapted to simulate resistance, capacitance and slew rate of actual WL;
   a SRAM circuit stage coupled to said WL circuit stage and operative to simulate the SRAM cell load and delay behavior;
   circuitry coupled to said SRAM circuit stage operative to generate a dynamic bias voltage signal applied to said SRAM circuit stage for controlling the speed of said SRAM array.

6. The circuit according to claim 5, wherein said bias voltage is operative to compensate for threshold voltage ($V_T$) mismatch among cells in said SRAM array.

7. The circuit according to claim 5, wherein devices in said SRAM circuit stage retain device relationships of real SRAM cell but are N times as large in order to minimize sensitivity to process variations.

8. The circuit according to claim 5, wherein the bias voltage applied to said passgate device is adapted to track $V_{CS}$ whereby a drop in $V_{CS}$ results in a corresponding drop in threshold voltage and bias voltage.

9. The circuit according to claim 5, wherein the bias voltage generated tracks changes in supply voltage.

10. The circuit according to claim 5, wherein the voltage drop generated across said passgate is similar to the supply voltage drop in a slow PVT corner thereby generating a WL restore delay that matches the speed of said SRAM array.

11. The circuit according to claim 5, wherein said bias circuitry comprises a divider including a resistive portion and a diode portion adapted to control the sensitivity of the bias voltage in different PVT corners.

12. A static random access memory (SRAM) restore tracking circuit for use in a SRAM array, comprising:
   a wordline (WL) circuit stage operative to simulate the WL load and delay behavior, said WL circuit stage comprising a WL driver coupled to a wire and load simulation circuit adapted to simulate resistance, capacitance and slew rate of actual WL;
   a SRAM circuit stage coupled to said WL circuit stage and operative to simulate the SRAM cell load and delay behavior, said SRAM circuit stage including a passgate transistor coupled between a pull-up transistor connected to $V_{CS}$ and a pull-down transistor connected to $V_{SS}$;
   bias circuitry coupled to said SRAM circuit stage operative to generate a dynamic bias voltage for compensating for threshold voltage ($V_T$) mismatch among cells in said SRAM array, said bias voltage applied to the gate of said passgate.

13. The circuit according to claim 12, wherein devices in said SRAM circuit stage retain device relationships of real SRAM cell but are N times as large in order to minimize sensitivity to process variations.

14. The circuit according to claim 12, wherein the bias voltage applied to said passgate device is adapted to track $V_{CS}$ whereby a drop in $V_{CS}$ results in a corresponding drop in threshold voltage and bias voltage.

15. The circuit according to claim 12, wherein the bias voltage generated tracks changes in threshold voltage.

16. The circuit according to claim 12, wherein the bias voltage generated tracks changes in supply voltage.

17. The circuit according to claim 12, wherein the voltage drop generated across said passgate is similar to the supply voltage drop in a slow PVT corner thereby generating a WL restore delay that matches the speed of said SRAM array.

18. The circuit according to claim 12, wherein the bias circuitry comprises a divider including a resistive portion and a diode portion adapted to control the sensitivity of the bias voltage in different PVT corners.

* * * * *